(12) United States Patent
Noda et al.

(10) Patent No.: US 7,893,522 B2
(45) Date of Patent: Feb. 22, 2011

(54) STRUCTURAL BODY AND MANUFACTURING METHOD THEREOF

(75) Inventors: Shuichi Noda, Tokyo (JP); Kimiaki Shimokawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/210,259

(22) Filed: Sep. 15, 2008

(65) Prior Publication Data

US 2009/0085174 A1    Apr. 2, 2009

(30) Foreign Application Priority Data

Sep. 27, 2007    (JP) .............................. 2007-251926

(51) Int. Cl.
    *H01L 23/58*    (2006.01)
(52) U.S. Cl. ................ 257/636; 257/618; 257/620; 257/622; 257/628; 438/476; 438/479; 438/763
(58) Field of Classification Search ................ 257/624, 257/625
    See application file for complete search history.

(56) References Cited

U.S. PATENT DOCUMENTS 5,721,145 A  *  2/1998  Kusakabe et al. .......... 148/33.3
5,877,094 A       3/1999  Egley et al.
2006/0102975 A1   5/2006  Nakamura et al.

FOREIGN PATENT DOCUMENTS

| JP | 03083725    | 6/2000 |
| JP | 2006-147788 | 6/2006 |
| JP | 2009-87979  | 4/2009 |

* cited by examiner

*Primary Examiner*—N Drew Richards
*Assistant Examiner*—Kyoung Lee
(74) *Attorney, Agent, or Firm*—Taft Stettinius & Hollister LLP

(57) ABSTRACT

The present invention includes a substrate structural body having a high electrostatic chuck force at a low voltage even when an insulated board is used, and a method for manufacturing the substrate structural body. As the substrate structural body, there is provided a substrate structural body for attaining its fixing by an electrostatic chuck mechanism, comprising at least a first polycrystalline silicon film formed on the back surface of a substrate comprised of an insulating material or its back and side surfaces, wherein a top layer of part of the back surface or the back and side surfaces is of a first silicon insulating film.

12 Claims, 5 Drawing Sheets

STRUCTURAL BODY AND MANUFACTURING METHOD THEREOF

CROSS-REFERENCE TO RELATED APPLICATIONS

This application is a claims priority under 35 U.S.C. §119 to Japanese Patent Application Serial No. JP2007-251926 filed on Sep. 27, 2007, entitled "SUBSTRATE STRUCTURAL BODY AND MANUFACTURING METHOD THEREOF," the disclosure of which is hereby incorporated by reference.

RELATED ART

Field of the Invention

The present invention relates to a substrate structural body and a manufacturing method thereof and, particularly, to a substrate structural body that may be fixed to an apparatus by an electrostatic chuck mechanism and a manufacturing method thereof.

Various mass production apparatuses used to form microstructures on a semiconductor substrate during a semiconductor integrated circuit manufacturing process have grown very powerful to adapt to subminiaturization of the semiconductor integrated circuit. Many devices such as various electronic devices, optical devices, MEMS devices, biotechnology-applied devices, nanotechnology-applied devices, etc., are impacted by subminiaturization of the semiconductor integrated circuit. More recently, semiconductor fabrication processes have been adapted to produce more compact devices, whether electronic or not. Some of these adapted processes utilize a silicon wafer as a substrate, which is often used as a substrate in normal semiconductor fabrication processes. However, if certain materials other than silicon are utilized coated or otherwise formed on the silicon substrate, such as, without limitation, sapphire, the substrate cannot be detected optically or electrically by a conventional silicon wafer automatic transfer system or the like.

To potentially address these detection concerns of an automatic transfer system, it has been proposed to form polysilicon over a silicon insulating film on the back surface of the wafer (See i.e., Japanese Unexamined Patent Publication No. 2006-147788 and Japanese Patent No. 3083725). In these references, the substrates may include a conductive polysilicon layer located in the top layer of the wafer back surface. But by addressing some of the detection problems, other problems have been created.

It has been found that wafers (hereinafter "insulated board") including this backside insulating material encounter difficulties in attaching the insulated board to a substrate stage using an electrostatic chuck mechanism, as compared with a simple silicon wafer where a plasma process apparatus is used in a conventional semiconductor process.

Referring to FIG. 8, an exemplary plasma etching apparatus includes an electrostatic chuck mechanism and a stage 109. The stage 109 comprises electrodes 105 for applying a high voltage, which are covered by a thin insulating material 106 (dielectric material such as a polymer film, ceramic or the like). A silicon wafer 107 is placed on the stage 109 and the high voltage is applied to the electrodes 105 in the presence of a plasma 108. In doing so, a closed circuit (virtual wiring in the figure) is formed in which the insulating material 106 interposes the silicon wafer 107 and the electrodes 105, using the plasma 108 as a conductive path. At this time, the silicon wafer 107 is chucked onto the stage 109 by a strong electrostatic attracting force between the electrodes 105 and the silicon wafer 107. Utilization of an electrostatic chuck mechanism has been found to be advantageous for allowing the quantity of heat generated by plasma heating to escape to the stage 109, while at the same time controlling the temperature and temperature distribution of the silicon wafer 107 with a high degree of accuracy and uniformly. Accordingly, a high-precision plasma process may be implemented.

But when the foregoing equipment is utilized with an insulated board, the electrostatic attracting force is very weak and can hardly be chucked. Therefore, conventional plasma processing does not use an electrostatic chuck, but instead uses press-fitting and mechanical attachment to secure the insulated board in position. By using press-fitting or mechanical attachment, a slight gap or clearance occurs between the stage and the insulated board so vastly diminished thermal conduction occurs between the stage and insulated board. It is therefore difficult to control the temperature of the insulated board. As a result, processing may be adversely affected. One example might include carrying out an etching process where the etch rate significantly varies and reproducibility between batches accordingly suffers.

The address the thermal conductivity concerns, one may interpose grease with respect to the stage and insulated board. However, this method is not preferred for mass production where high reliability and high throughput capacity are essential.

Further problems using conventional insulated boards arise from attenuation of the RF bias power of the stage 109 applied to the surface of the insulated board. This attenuation results from the gap or clearance existing between the insulating board and stage. As a result, processing speed is reduced and in-plane uniformity is degraded significantly.

Alternatively, when the substrate includes an exposed conductive layer on the underside of the substrate, the substrate can be fixed to the stage using an electrostatic chuck, but the voltage necessary to achieve polarity difference is 1000V or higher.

INTRODUCTION TO THE INVENTION

The present invention may provide a substrate structural body capable of performing an electrostatic chuck easily and reliably even when an insulated board is used. According to a first embodiment, there is provided a substrate structural body for mounting to an electrostatic chuck mechanism. The substrate structural body comprises a first polycrystalline silicon film formed over a back surface of a substrate (comprised of an insulating material on the back and side surfaces thereof), and a first silicon insulating film formed over the first polycrystalline silicon film to leave exposed at least a portion of the first polycrystalline silicon film. In an alternate exemplary embodiment, the first polycrystalline silicon film is doped with an impurity.

Using an electrostatic chuck, after a high voltage is applied to the polycrystalline silicon on the back and side surfaces of the substrate structural body, electric charges of polarity opposite to electrodes of the chuck are generated at the substrate structural body of the first embodiment. Further, since the top layer lying on the back and side surfaces of the substrate structural body comprises a silicon insulating film, the impressed voltage for mounting the substrate structural body to the stage of the electrostatic chuck can be lower.

In a circumstance where the first polycrystalline silicon film is doped with an impurity, an electrostatic chuck force is enhanced since the electrical resistance of the polycrystalline silicon film can be reduced.

A further alternate exemplary embodiment of a substrate structural body includes a second polycrystalline silicon film and a second silicon insulating film provided between the first polycrystalline silicon film and the first silicon insulating film. Using this exemplary structure, the substrate structural body may be made opaque by laminating the polycrystalline silicon film and the silicon insulating film on each other even when the substrate is transparent (such as when using sapphire).

An even further alternate exemplary embodiment of a substrate structural body includes chamfered portions of the first polycrystalline silicon film at surface ends of the substrate. Using this exemplary structure, the exposure of the polycrystalline silicon film at the chamfered portions makes it easy to form a closed circuit including an electric capacitive element with a dielectric material interposing polycrystalline silicon and each electrode with a plasma as a conductive path.

A still further alternate exemplary embodiment of a substrate structural body comprises a ceramic or an organic substance that is thermally resistant. Specifically, the ceramic may include quartz. Using this exemplary structure, the general-purpose materials such as ceramics or organic substances are capable of allowing a sufficient electrostatic chuck force.

According to yet a further alternate exemplary embodiment, there is provided a method for manufacturing a substrate structural body using an electrostatic chuck mechanism, comprising the steps of preparing a substrate comprised of an insulating material, forming a polycrystalline silicon film over the entire surface of the substrate, forming a silicon insulating film in such a manner that the polycrystalline silicon film at at least part of each side face end of the substrate is exposed, and etching the polycrystalline silicon film provided over the surface of the substrate.

According to the manufacturing method of the substrate structural body described above, the order of forming or growing a polycrystalline silicon film and a silicon insulating film on a conventional SOS substrate is carried out in reverse. It is therefore possible to manufacture a substrate structural body capable of using an electrostatic chuck without increasing the number of process steps.

An alternate exemplary method for manufacturing a substrate structural body includes providing the surface ends of the substrate with chamfered portions. When the silicon insulating film is grown from the back surface of the substrate, it may not be grown on the chamfered portions at the surface ends, and the polycrystalline silicon is brought to an exposed state.

In a further alternate exemplary method for manufacturing a substrate structural body, the polycrystalline silicon film is formed using a low pressure chemical vapor deposition method.

In yet a further alternate exemplary method for manufacturing a substrate structural body, silicon insulating film is formed using a plasma chemical vapor deposition method.

It is a first aspect of the present invention to provide a substrate structural body for use with an electrostatic chuck mechanism, comprising: (a) a polycrystalline silicon film formed over a bottom surface and a periphery of a substrate, the substrate comprising at least one of a semiconductor material and an insulating material; and (b) a silicon insulating film formed over the first polycrystalline silicon film, where at least a portion of the polycrystalline silicon film over the periphery is not covered by the silicon insulating film.

In a more detailed embodiment of the first aspect, the first polycrystalline silicon film is doped with an impurity. In a further detailed embodiment, the embodiment further comprises an additional polycrystalline silicon film and an additional silicon insulating film provided between the polycrystalline silicon film and the silicon insulating film. In still a further detailed embodiment, the periphery of the substrate includes a chamfered portion, and the portion of the polycrystalline silicon film over the periphery not covered by the silicon insulating film includes the chamfered portion. In a more detailed embodiment, the substrate comprises at least one of a ceramics and a heat resistant organic substance. In another more detailed embodiment, the substrate is a ceramic and the ceramic includes quartz.

It is a second aspect of the present invention to provide a method for manufacturing a substrate structural body for use with an electrostatic chuck mechanism, comprising: (a) preparing a substrate comprising at least one of an insulating material and a semiconductor material; (b) forming a polycrystalline silicon film over the entire surface of the substrate; (c) forming a silicon insulating film in such a manner that the polycrystalline silicon film at least part of each side face end of the substrate is exposed; and (d) etching the polycrystalline silicon film provided over the surface of the substrate.

In a more detailed embodiment of the second aspect, the surface ends of the substrate are provided with chamfered portions respectively. In yet another more detailed embodiment, the step of forming the polycrystalline silicon film uses a low pressure chemical vapor deposition method. In a further detailed embodiment, the step of forming the silicon insulating film uses a plasma chemical vapor deposition method.

It is a third aspect of the present invention to provide a method for manufacturing a substrate structural body for use with an electrostatic chuck mechanism, comprising: (a) forming a polycrystalline silicon film over a bottom surface and a periphery of a substrate, the substrate comprising at least one of an insulating material and a semiconductor material; (b) forming a silicon insulating film over the polycrystalline silicon film over the bottom surface and over the periphery, where at least a portion of polycrystalline silicon film at the periphery of the substrate is not covered by the silicon insulating layer; and (c) etching the polycrystalline silicon film provided over the surface of the substrate.

DETAILED DESCRIPTION

The exemplary embodiments of the present invention are described and illustrated below to encompass substrate structural bodies and manufacturing methods thereof and, particularly, to substrate structural bodies that may be fixed to an apparatus by an electrostatic chuck mechanism and manufacturing methods thereof. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

As used herein, "at least part" represents that part of each side surface of the substrate covered with a silicon insulating film. This "part" means a continuously-connected portion as viewed from the back surface of the substrate. It also includes a form in which a polycrystalline silicon film is exposed over all of the substrate side surfaces.

Figure 1:
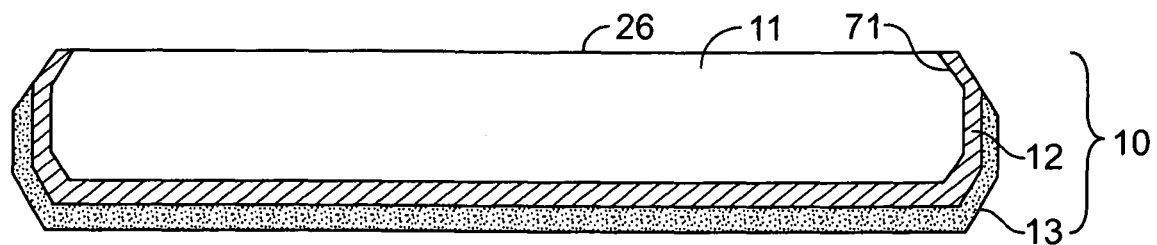
FIG. 1 is a sectional view of a substrate structural body according to a first exemplary embodiment.

Referring to FIG. 1, a first exemplary substrate structural body 10 comprises a polycrystalline silicon film 12 (first polycrystalline silicon film) stacked or laminated over the bottom and side surfaces of a silicon substrate 11, and a silicon insulating film 13 (first silicon insulating film) laminated over the polycrystalline silicon film 12 to leave exposed a portion 26 of the polycrystalline silicon film 12 on side surfaces. That is, the polycrystalline silicon film 12 is exposed at chamfered portions 71 provided at the periphery of the substrate 11. The exposed portions of the polycrystalline silicon film 12 provide current paths to form a closed circuit, thereby making it easy to electrostatically attach the substrate structural body. Although the polycrystalline silicon film 12 is exposed only at the chamfered portions 71 in the embodiment of FIG. 1, the polycrystalline silicon film 12 may be exposed over the entire side surface. In the present embodiment, the thickness of the polycrystalline silicon film 12 may preferably range from approximately 10 nm to approximately 200 nm based upon the fact that a continuous layer is formed on the substrate 11. The thickness of the silicon insulating film 13 may preferably range from approximately 100 nm to approximately 1000 nm to form a perfect or full insulating layer free of electrical leaks.

Figure 2:
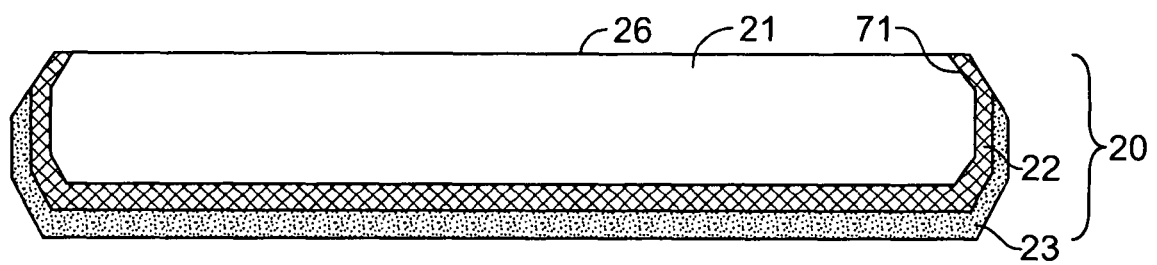
FIG. 2 is a sectional view of a substrate structural body according to a second exemplary embodiment.

Referencing FIG. 2, a second exemplary substrate structural body 20 includes a polycrystalline silicon film 22 doped with an impurity, such as phosphorous for example, to reduce the electrical resistance of the polycrystalline silicon film. The amount of dopant may preferably range from approximately $0.5 \times 10^{20}$ ion/cm³ to approximately $4 \times 10^{20}$ ion/cm³. A silicon insulating film 23 is formed over the polycrystalline silicon film 22 similar to the first exemplary substrate structural body 10.

Figure 3:
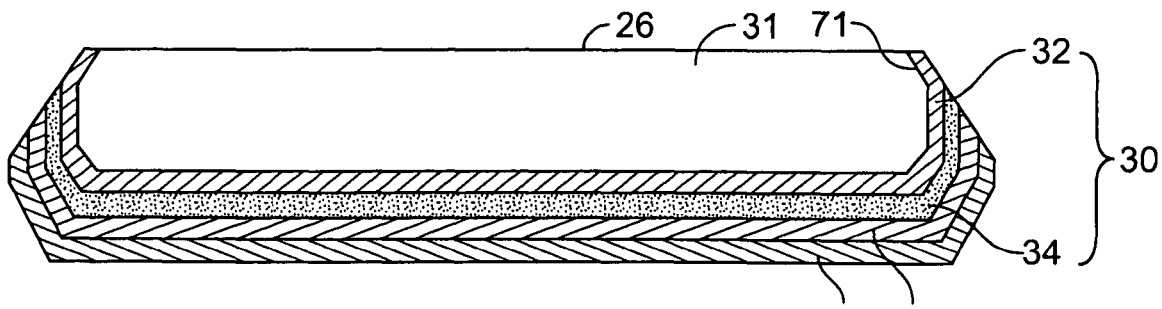
FIG. 3 is a sectional view of a substrate structural body according to a third exemplary embodiment.

Referring to FIG. 3, a third exemplary substrate structural body 30 includes an additional polycrystalline silicon film 35 (second polycrystalline silicon film) and an additional silicon insulating film 34 (second silicon insulating film) provided between a polycrystalline silicon film 32 (first polycrystalline silicon film) and a silicon insulating film 33 (first silicon insulating film). Although the films corresponding to the two layers 34, 35 are formed between the polycrystalline silicon film 32 and the silicon insulating film 33, it is to be understood that these two layers 34, 35 are exemplary and additional layers, including for example six layers, may be used between the films 32, 33. For example, in a circumstance where the substrate 31 is formed of an optically transparent material such as a sapphire, a stacked or laminated film comprised of materials different in refractive index may be formed between the polycrystalline silicon film 32 and the silicon insulating film 33. In addition, or in the alternative, an optical reflective film may interpose the films 32, 33. For example, a film comprised of SiN, $Al_2O_3$, $TaO_3$ or the like may be utilized. The thicknesses of the polycrystalline silicon film 32 and the silicon insulating film 33 are similar to first exemplary substrate structural body 10.

The wavelength of light desired to suppress its transmittance can be changed by adjusting the thicknesses of the polycrystalline silicon film 35 and the silicon insulating film 34. When the thickness of the polycrystalline silicon film 35 is set to approximately 42 nm and the thickness of the silicon insulating film 34 is set to approximately 110 nm, application of a semiconductor laser light of 633 nm, for example, to a device being used as a sensor, the light having this wavelength can be attenuated selectively, and its attenuation rate can be increased as the number of layers increases.

It is also within the scope of the invention to provide a substrate (11, 21, or 31) other than silicon. For example, an exemplary substrate 11 may comprise a ceramic or an organic substances having adequate thermal resistance and strength. Exemplary ceramics include, without limitation, quartz, sapphire, alumina, TiN, SiC, BN, etc. Quartz may be of particular interest based upon impurity countermeasures for forming a semiconductor element or device on an insulated board, and its heat resistance. Exemplary organic substances include, without limitation, polycarbonate, polyarylate, polyimide, etc. One skilled in the art would be able to select the substrate based upon its desired purpose(s). It is also within the scope of the invention to utilize alloys of the foregoing materials.

The chamfered portions 71 may be provided proximate at least the surface ends of the substrate. As the shape of each chamfered portion 71, an R plane or a C plane may be adopted. It is not required that the silicon insulating film be completely laminated on the ends of the substrate.

A desired process is enabled promptly if as the external shape and thickness of the substrate according to the present invention, those based on the SEMI or JEITA standards of a silicon wafer processable by an apparatus to be used are prepared.

Figure 4A:
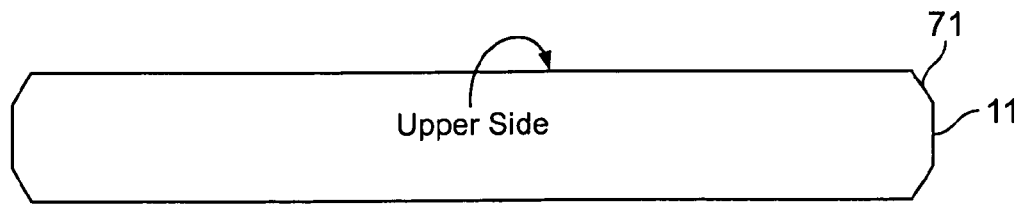
FIG. 4 is a process sectional view of a method for manufacturing the substrate structural body according to the first exemplary embodiment.
Figure 4B:
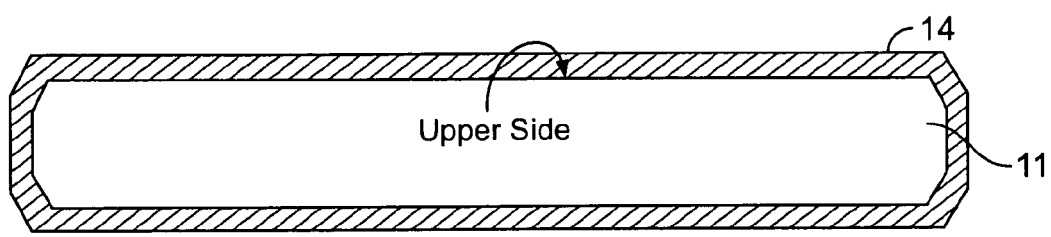

Referring to FIGS. 4(a)-4(b), an exemplary method of manufacturing the first exemplary substrate structural body 10 begins with a substrate 11 optionally provided with chamfered portions 71 proximate the periphery of the substrate. In exemplary form, the substrate comprises 5-inch quartz disc having a thickness of approximately 625 μm and is formed to the outer dimensions of a 5-inch Si substrate based on the Japan Electronics and Information Technology Industries Association (JEITA) standards.

Next, a 400 nm polycrystalline silicon film 14 is laminated over the full front and back surfaces of the substrate 11. Although the polycrystalline silicon film 14 may be formed using known deposition or growth methods, in exemplary form the polycrystalline silicon film 14 may is grown using a conventional low pressure chemical vapor deposition method (LPCVD). More specifically, LPCVD may utilize $SiH_4$ as a gaseous species, with a gas flow rate ranging between approximately 200 sccm to approximately 300 sccm, and with pressures ranges from approximately 0.1 Torr to approximately 0.3 Torr. In addition, operating LPCVD temperatures may range between approximately 600° C. to approximately 650° C. Incidentally, when the polycrystalline silicon film 14 is doped with an impurity such as phosphorus (see FIG. 2), the film may be formed by using, for example, a mixed gas of $SiH_4$ and $PH_3$, with gas flow rates for $SiH_4$ at approximately 1000 sccm and for $PH_3$ at approximately 10-30 sccm, with a pressure thereof ranging from approximately 0.5 Torr to approximately 0.7 Torr, and with a growth temperature ranging from approximately 500° C. to approximately 600° C.

Figure 4C:
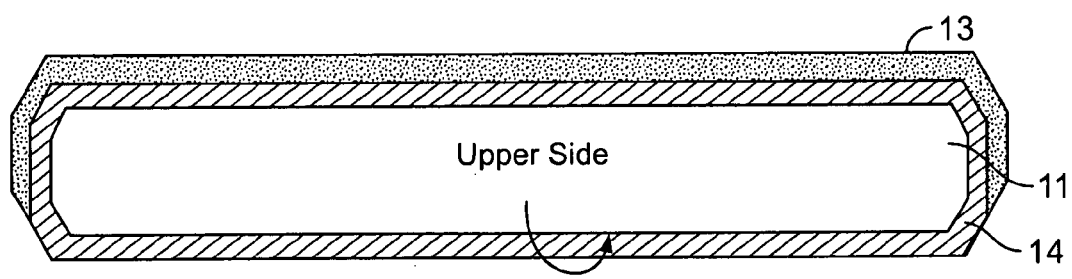

Thereafter, as shown in FIG. 4(c), the silicon insulating film 13 is laminated on the bottom of the substrate 11 to leave exposed the polycrystalline silicon film 14 on the top surface and top chamfered end. Although the silicon insulating film 13 may be formed using known deposition or growth methods, in this exemplary process the silicon insulating film 13 is grown using a conventional plasma chemical vapor deposition (PCVD) method. More specifically, the PCVD method may utilize a mixture of TEOS and $O_2$ as gaseous species, and reaction pressures ranges from approximately 3 Torr to approximately 5 Torr. Exemplary PCVD growth temperatures range from approximately 400° C. to approximately 450° C. Exemplary PCVD plasma excitation RF power ranges from approximately 400 W to approximately 500 W.

Figure 4D:
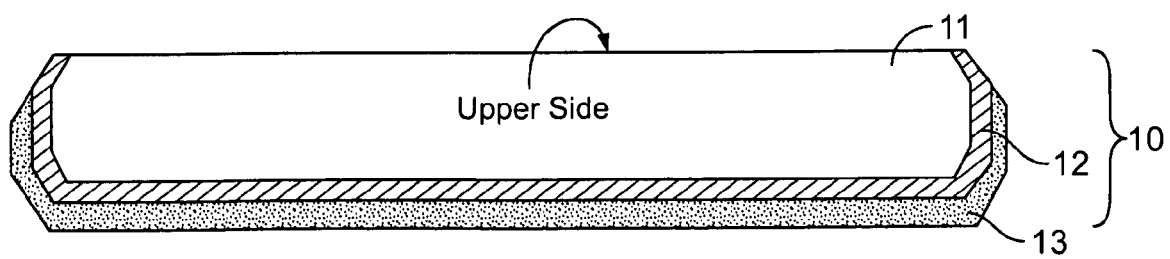

Finally, as shown in FIG. 4(d), the polycrystalline silicon film 14 laminated on the top surface of the substrate 11 removed by plasma etching to expose the top surface of the substrate. Exemplary etching gases that may be utilized to perform this plasma etching include, without limitation, $Cl_2$, $CF_4$, $SF_6$, and HBr. Exemplary chamber internal pressures for plasma etching range between approximately 50 mTorr to approximately 100 mTorr. Exemplary output ranges from approximately 200 W to approximately 500 W.

In exemplary form, the steps discussed with respect to FIGS. 4(c) and 4(d) are sequentially repeated to form the desired laminated body. By way of example, the product of FIG. 4(d) may be utilized as an intermediate to manufacture the substrate structural body as shown in FIG. 3.

An example illustrative of a case in which the substrate structural body shown in FIG. 1 is used and its processing is carried out by a plasma etching apparatus will next be explained using FIG. 5.

Figure 5:
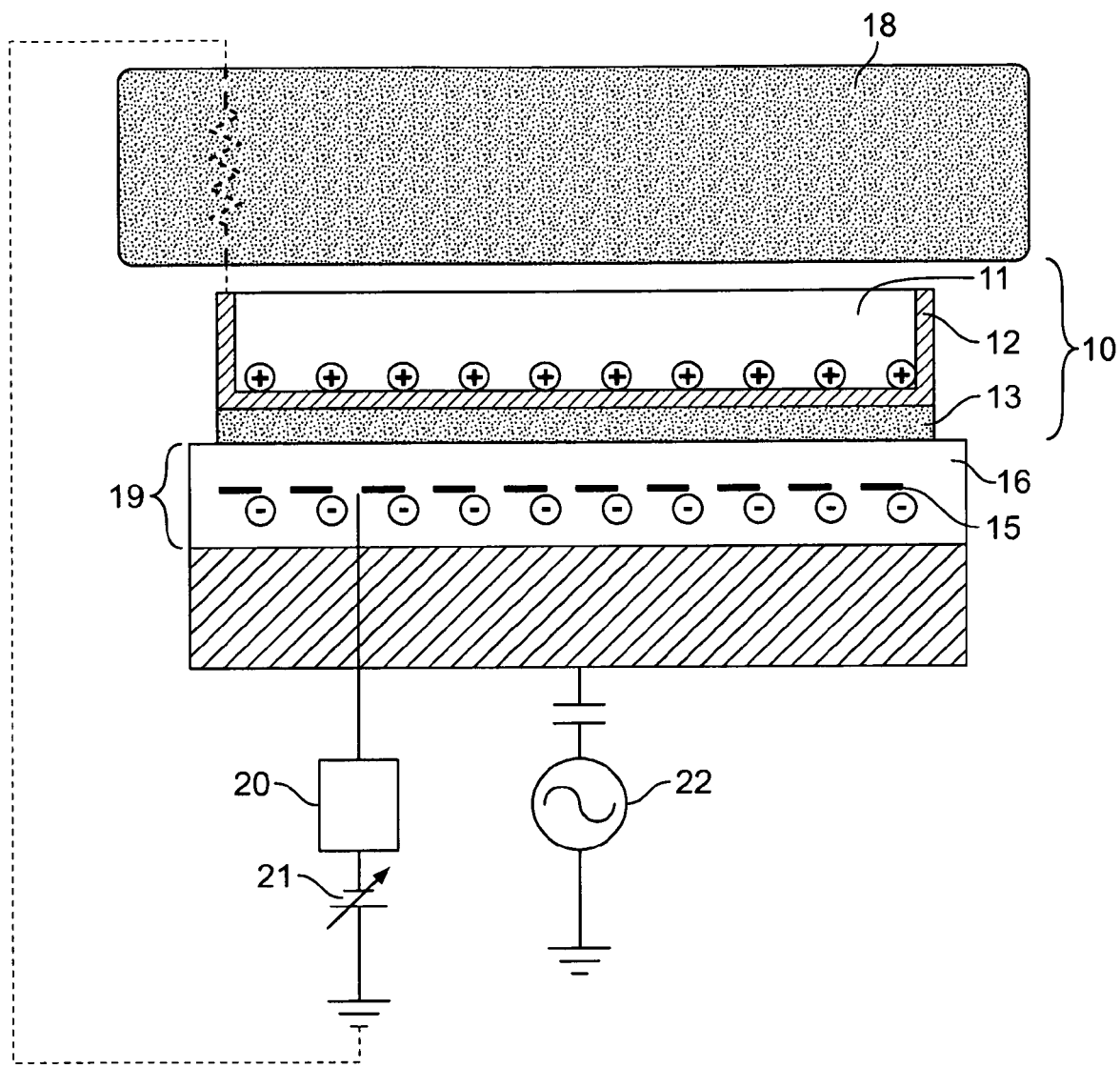
FIG. 5 is a sectional view of a plasma etching apparatus with the substrate structural body according to the first exemplary embodiment placed therein.

Referencing FIG. 5, an exemplary structural body 10 is processed by a plasma etching apparatus. While only a cross-section substrate structural body 10 and the cross-section of a substrate stage 19 are shown in FIG. 5, and many other parts are omitted, the corresponding apparatus is similar to the plasma etching apparatus as shown in FIG. 11. This apparatus is of an apparatus having a magneto-microwave plasma source, which has a structure in which an electrostatic chuck mechanism is mounted to the substrate stage 19 and an RF bias power of 2 MHz is applied by an RF source or power supply 22. A DC high-voltage power supply 21 is connected to electrostatic chuck electrodes 15 via a low-pass filter 20 to apply the voltage to the electrostatic chuck mechanism. Those skilled in the art are familiar with the operation of electrostatic chucks and for purposes of brevity only further discussion will be omitted.

The substrate structural body 10 of the present invention is first placed on its corresponding substrate stage 19. It should be noted that the substrate structural body is represented in a manner slightly different than in FIG. 3 merely to show the clamping effect of the chuck electrodes 15. Next, a voltage of −600V is applied to the electrostatic chuck electrodes 15 from the DC high-voltage power supply 21. Then, a discharge gas(es) having a predetermined flow rate utilized to adjust the pressure. In the case of the substrate structural body shown in FIG. 1, an argon gas of 50 sccm is utilized to make an adjustment to a pressure of 1 mTorr. Next, a microwave is radiated to a chamber 25 (See FIG. 7, 250 mA at a magnetron current value), the argon gas is ionized to generate a plasma 18. At this time, the substrate 11 is an insulator (quartz), but part of the polycrystalline silicon film 12 laminated and grown on the bottom surface of the substrate 11 is exposed. Thus, since charged particle flux from the plasma 18 flows, a closed circuit is formed with the exposed part as a current path. In doing so, a capacitive element circuit is formed using the polycrystalline silicon film 12 and the electrostatic chuck electrodes 15 as opposing electrodes. Thus, the substrate structural body 10 is adsorbed or chucked to the surface of the substrate stage 19 by a coulomb force based on electric charges of reverse polarity induced to the electrode.

Here, the silicon insulating film 13 may be considered to be unnecessary to adsorb or chuck the substrate 11 onto the surface of the substrate stage 19 by the electrostatic chuck mechanism. There is, however, a tendency for the electrostatic chuck force to increase repeatedly and continuously since the substrate 11 is in contact with the substrate stage 19 via the silicon insulating film 13 interposed therebetween.

Figure 7:
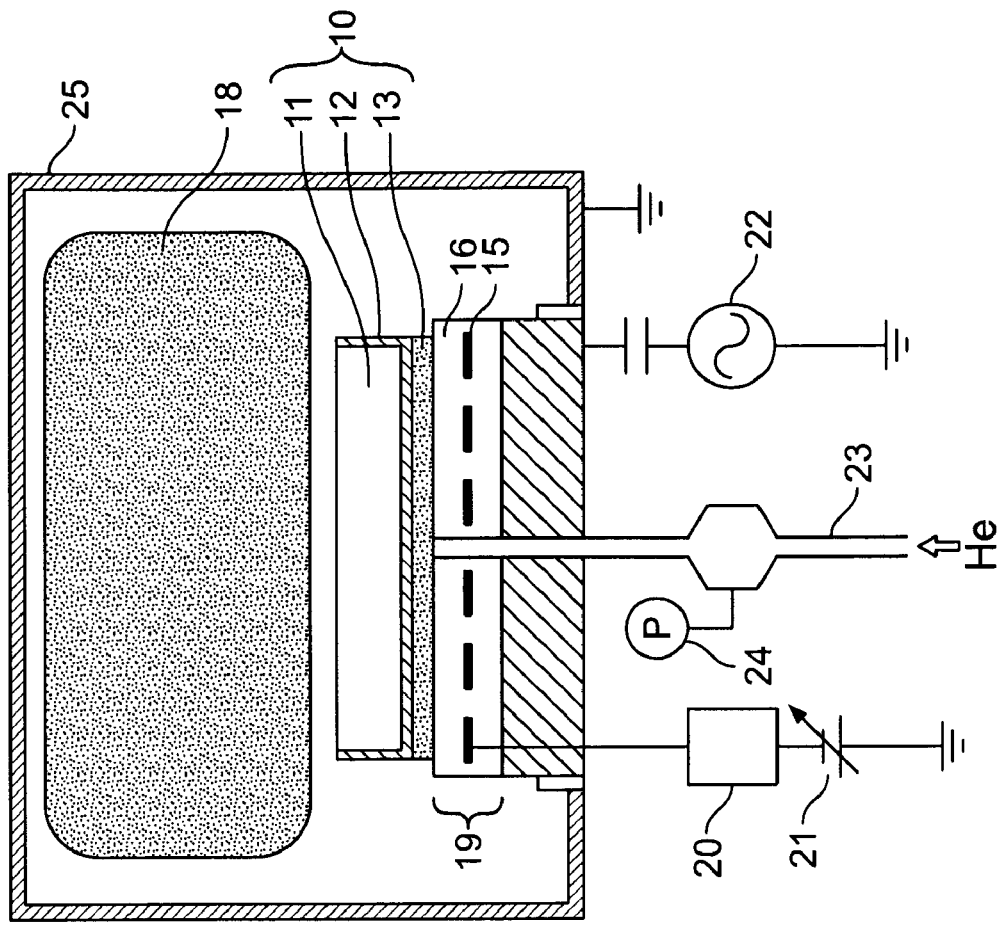
FIG. 7 is a sectional view of an apparatus for evaluating an electrostatic chuck force.
Figure 6:
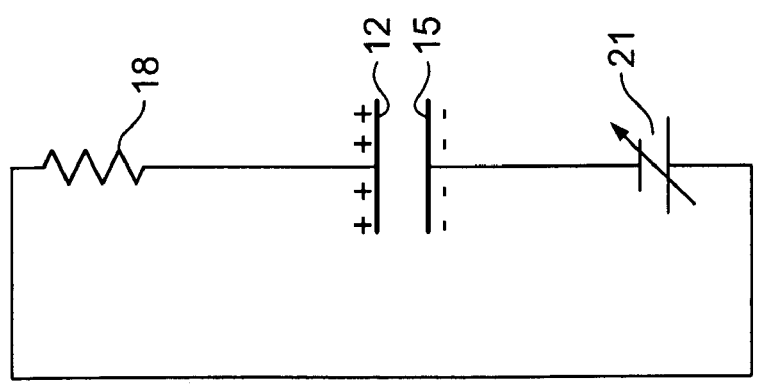
FIG. 6 shows a capacitive element circuit in which a polycrystalline silicon film and an electrostatic chuck electrode are formed as opposing electrodes.

Referring to FIG. 7, the electrostatic chuck force of the substrate structural body manufactured consistent with the foregoing embodiments was evaluated. This testing apparatus includes a magneto-microwave plasma source (not shown) and an electrostatic chuck mechanism mounted to a substrate stage 19, where the voltage applied to the corresponding electrostatic chuck electrode 15 is variable. This testing apparatus is provided with a helium-introducible structure 23 to introduce helium gas between the substrate structural body 10 and the substrate stage 19. It is of a structure wherein thermal conduction can further be enhanced in vacuum. The flow rate of helium introduced to the back surface of the substrate structural body 10 is feedback-controlled in such a manner that the pressure of charged helium gas is monitored by a pressure gauge 24 and its value becomes 10 Torr. When the substrate structural body 10 is electrostatically chucked by a sufficient chuck force, the value reaches 10 Torr in a short time at a small flow rate of helium and thereafter the value achieved is kept constant in a state in which the helium flow rate is zero. When the chuck force of the substrate structural body 10 falls short in reverse, the helium flow rate increases automatically and is feedback-controlled so as to approach 10 Torr. When the chuck force falls short significantly, helium leaks into the chamber 25 even though helium of a maximum flow rate is introduced, and the helium flow rate does not reach 10 Torr.

The electrostatic chuck force has a tendency to increase as the voltage applied to the electrostatic chuck electrode 15 becomes greater. Thus, ease of electrostatic chuck of the substrate structural body 10 is high as the voltage applied to the corresponding electrostatic chuck electrode at the time that a predetermined electrostatic chuck force is obtained, becomes low. On the other hand, when a predetermined voltage is being applied thereto, the electrostatic chuck force becomes higher as the pressure of helium fillable into the back surface of the substrate structural body 10 becomes high.

The evaluation results are shown in Table 1. Incidentally, A in symbols described as A/B indicates back-surface helium pressure (Torr) after 30 seconds have elapsed from the start of discharge. B indicates a flow rate (sccm) of helium.

TABLE 1

| | Chuck voltage (V) | | | |
|---|---|---|---|---|
| | −400 | −600 | −800 | −1000 |
| First exemplary embodiment | 5.0/10 | 10/0 | — | — |
| Second exemplary embodiment | 5.1/10 | 10/0 | — | — |
| Third exemplary embodiment | 5.0/10 | 10/0 | — | — |

TABLE 1-continued

| | Chuck voltage (V) | | | |
|---|---|---|---|---|
| | −400 | −600 | −800 | −1000 |
| First comparative example | 5.0/10 | 5.0/10 | 5.6/10 | 7.1/10 |
| Second comparative example | 5.2/10 | 5.6/10 | 6.6/10 | 10/0 |
| Third comparative example | 5.0/10 | 5.9/10 | 8.9/5 | 10/0 |

Figure 8:
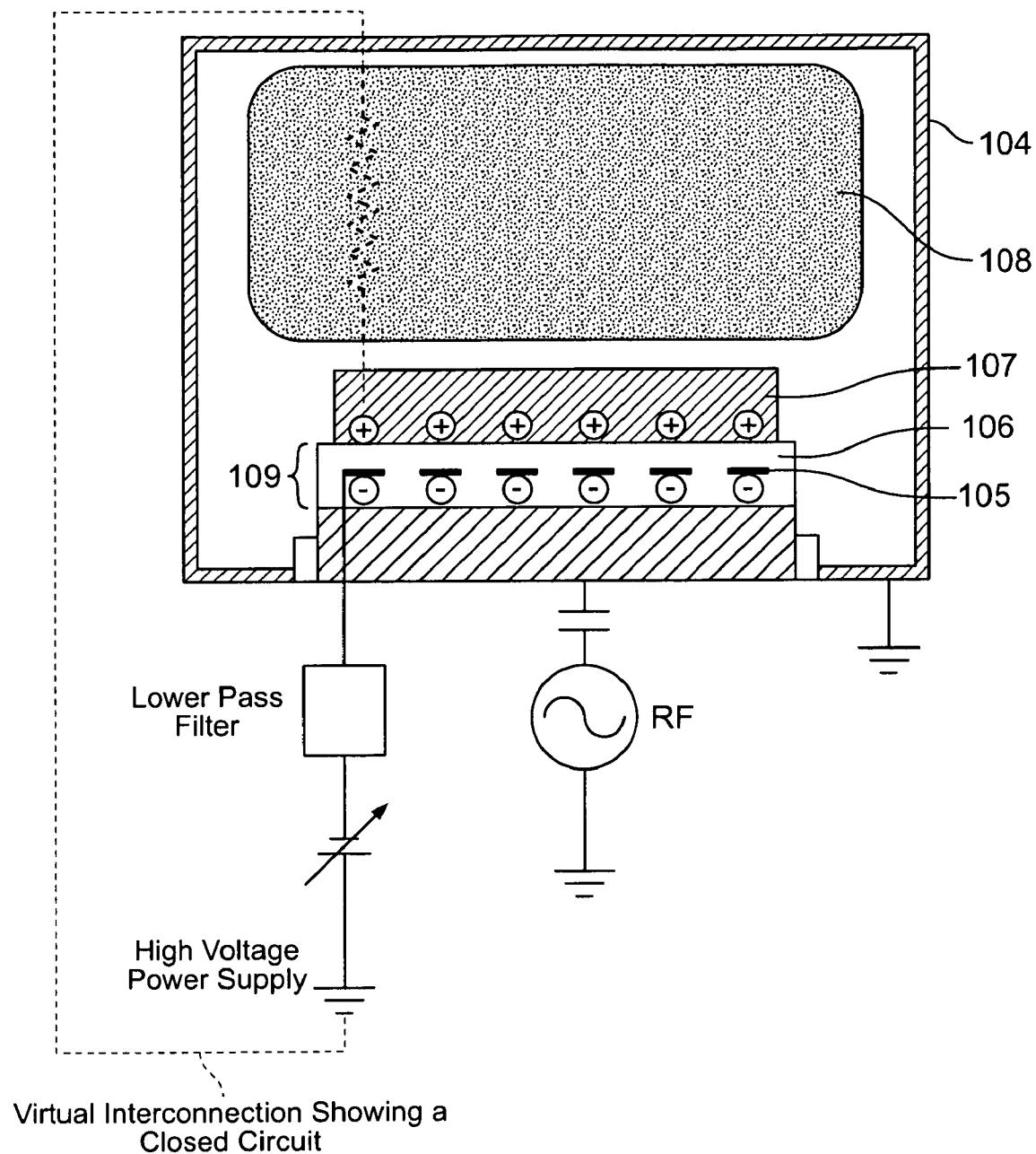
FIG. 8 is a sectional view of a plasma etching apparatus with a substrate structural body placed therein.

Electrostatic chuck forces were evaluated in a manner similar to the first exemplary embodiment for the substrate structural bodies 20, 30 of the second and third exemplary embodiments, by way of a comparative example, substrates shown in FIGS. 8-10 were tested. FIG. 8 represents a substrate 41 by itself, whereas FIG. 9 represents a substrate 51 with only a polycrystalline silicon film 52 laminated over the bottom surface of the substrate 51, and whereas FIG. 10 represents a substrate 61 in which the top layer was formed of a polycrystalline silicon film 54, the intermediate layer was formed of {what is the composition of layers 52 and 53 of FIG. 10}. The evaluation results are shown in Table 1.

It has been found that in the first through third exemplary embodiments, the normal electrostatic chuck force can be obtained at −600V. On the other hand, the normal electrostatic chuck force could not be obtained in the first comparative example even when −1000V was applied and the flow rate of helium at the back surface was set to 10 sccm. In the second comparative example, the normal electrostatic chuck force was eventually obtained at −1000V. Even in the third comparative example, the normal electrostatic chuck force was eventually obtained at −1000V in a manner similar to the second comparative example.

From the above results, the electrostatic chuck can be utilized with other insulating boards having other structures, but these other structures have been shown in the comparative testing to be less desirable. Accordingly, the majority of the electrostatic chuck force was generated due to the provision of the polycrystalline silicon film on the bottom surface of the insulated board. It has been found that it is beneficial to laminate the silicon insulating film as the upper most exposed layer on the bottom of the substrate in order to obtain preferred electrostatic chuck force at a relatively low applied voltage. It has been found that at this time, the electrostatic chuck force does not necessarily depend on the electrical resistance of the polycrystalline silicon film. As a result, a high electrical resistance polycrystalline silicon film may also be used that allows for a sufficient chuck force.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A substrate structural body for use with an electrostatic chuck mechanism, comprising:
   a polycrystalline silicon film formed over a bottom surface and a peripheral side surface of a substrate, the substrate comprising at least one of a semiconductor material and an insulating material; and
   a silicon insulating film formed over the polycrystalline silicon film, where at least a portion of a peripheral side surface of the polycrystalline silicon film formed over the peripheral side surface of the substrate is not covered by the silicon insulating film.

2. The substrate structural body of claim 1, wherein the polycrystalline silicon film is doped with an impurity.

3. The substrate structural body of claim 2, further comprising an additional polycrystalline silicon film and an additional silicon insulating film provided between the polycrystalline silicon film and the silicon insulating film.

4. The substrate structural body of claim 1, further comprising an additional polycrystalline silicon film and an additional silicon insulating film provided between the polycrystalline silicon film and the silicon insulating film.

5. The substrate structural body of claim 1, wherein:
   the periphery of the substrate includes a chamfered portion; and
   the portion of the polycrystalline silicon film over the periphery not covered by the silicon insulating film includes the chamfered portion.

6. The substrate structural body of claim 2, wherein:
   the periphery of the substrate includes a chamfered portion; and
   the portion of the polycrystalline silicon film over the periphery not covered by the silicon insulating film includes the chamfered portion.

7. The substrate structural body of claim 3, wherein:
   the periphery of the substrate includes a chamfered portion; and
   the portion of the polycrystalline silicon film over the periphery not covered by the silicon insulating film includes the chamfered portion.

8. The substrate structural body of claim 1, wherein the substrate comprises at least one of a ceramics and a heat resistant organic substance.

9. The substrate structural body of claim 2, wherein the substrate comprises at least one of a ceramics and a heat resistant organic substance.

10. The substrate structural body of claim 3, wherein the substrate comprises at least one of a ceramics and a heat resistant organic substance.

11. The substrate structural body of claim 5, wherein the substrate comprises at least one of a ceramics and a heat resistant organic substance.

12. The substrate structural body according to claim 5, wherein the substrate is a ceramic and the ceramic includes quartz.

* * * * *